US008223564B2

(12) United States Patent
Koike (10) Patent No.: US 8,223,564 B2
(45) Date of Patent: Jul. 17, 2012

(54) SEMICONDUCTOR STORAGE DEVICE

(75) Inventor: Tsuyoshi Koike, Kyoto (JP)

(73) Assignee: Panasonic Corporation, Osaka (JP)

( * ) Notice: Subject to any disclaimer, the term of this patent is extended or adjusted under 35 U.S.C. 154(b) by 290 days.

(21) Appl. No.: 12/675,069

(22) PCT Filed: Feb. 27, 2009

(86) PCT No.: PCT/JP2009/000902
§ 371 (c)(1),
(2), (4) Date: Feb. 24, 2010

(87) PCT Pub. No.: WO2010/016164
PCT Pub. Date: Feb. 11, 2010

(65) Prior Publication Data
US 2011/0116329 A1 May 19, 2011

(30) Foreign Application Priority Data
Aug. 7, 2008 (JP) .................................. 2008-204734

(51) Int. Cl.
*G11C 7/22* (2006.01)

(52) U.S. Cl. ........ 365/189.15; 365/189.16; 365/189.011; 365/191; 365/233.1

(58) Field of Classification Search ........... 365/189.011, 365/189.15, 189.16, 190, 196, 202, 189.14
See application file for complete search history.

(56) References Cited

U.S. PATENT DOCUMENTS

| 5,307,322 | A | 4/1994 | Usami et al. |
|---|---|---|---|
| 5,381,372 | A | 1/1995 | Kozuka et al. |
| 7,379,362 | B2 | 5/2008 | Abe et al. |
| 7,388,774 | B1 | 6/2008 | Kim |
| 2002/0163839 | A1 | 11/2002 | Jeung |
| 2004/0037108 | A1 | 2/2004 | Notani |
| 2004/0076065 | A1* | 4/2004 | Jeung ....................... 365/230.05 |
| 2005/0002225 | A1 | 1/2005 | Kanehara et al. |
| 2006/0146638 | A1 | 7/2006 | Chang et al. |

(Continued)

FOREIGN PATENT DOCUMENTS

JP 05-012870 A 1/1992

(Continued)

OTHER PUBLICATIONS

M. Sumita et al., "A 32b 64-Word 9-Read-Port/7-Write-Port Pseudo Dual-Bank Register File Using Copied Memory Cells for a Multi-Threaded Processor," ISSCC Digest of Technical Papers, pp. 384-385, 2005.

*Primary Examiner* — Thong Q Le
(74) *Attorney, Agent, or Firm* — McDermott Will & Emery LLP (57) ABSTRACT

A memory cell (100) includes a read circuit (30) whose output wiring is a read bit line (RBIT) and which has a switching transistor (31), a reset transistor (32), and an output wiring driving transistor (33). The switching transistor (31) connects a data holding node (MD) of a storage circuit (10) and a control line (DR) in accordance with a control signal on a read word line (/RWL0). The reset transistor (32) resets the control line (DR) in accordance with a reset control signal (RST). The output wiring driving transistor (33) has a gate connected to the control line (DR), a drain connected to the read bit line (RBIT), and a source connected to a ground power supply.

15 Claims, 11 Drawing Sheets

U.S. PATENT DOCUMENTS

2007/0041239 A1  2/2007  Takeda

FOREIGN PATENT DOCUMENTS

| | | |
|---|---|---|
| JP | 06-203568 A | 7/1994 |
| JP | 2005-025859 | 1/2005 |
| JP | 2006-286068 | 10/2006 |
| JP | 2006-286100 | 10/2006 |
| WO | WO 2005/041203 A1 | 5/2005 |

* cited by examiner

SEMICONDUCTOR STORAGE DEVICE

RELATED APPLICATIONS

This application is the U.S. National Phase under 35 U.S.C. §371 of International Application No. PCT/JP2009/000902, filed on Feb. 27, 2009, which in turn claims the benefit of Japanese Application No. 2008-204734, filed on Aug. 7, 2008, the disclosures of which Applications are incorporated by reference herein.

TECHNICAL FIELD

The present invention relates to semiconductor storage devices, and more particularly, to circuits for reading memory cells.

BACKGROUND ART

There are known semiconductor storage devices having a multiport configuration. For example, such a semiconductor storage device typically includes memory cells each of which includes a storage circuit, a single write circuit and two read circuits. In each read circuit, two or more transistors are connected in series between a bit line and a ground power supply. A data holding node of the storage circuit is connected to the gate of a transistor closer to the ground, and a word line is connected to the gate of another transistor (see PATENT DOCUMENT 1).

CITATION LIST

Patent Document

PATENT DOCUMENT 1: Japanese Patent Laid-Open Publication No. H05-12870

SUMMARY OF THE INVENTION

Technical Problem

According to the aforementioned conventional semiconductor storage device, multiple transistors having a large size which are connected in series are required for each read circuit so that a bit line is fully amplified, leading to an increase in the area of a memory cell.

Moreover, as the transistor size is increased to increase the speed, the length of the bit line, and the diffusion capacitance of the transistor accompanying the bit line are increased. As a result, even if the transistor size is increased, the read speed reaches saturation.

Moreover, as device processing uses finer design rules, a reduction in the speed of serially-connected multiple transistors at a low power supply voltage has become more significant, and therefore, a reduction in the read speed at a low power supply voltage has become more problematic.

In recent years, there has been an increasing demand for support for processes under finer design rules, reduced areas of SOC (silicon on chip) memories, increased speeds, and multiport configurations. Therefore, increasing attention has been paid to the aforementioned problems.

The present invention has been made in view of such circumstances. It is an object of the present invention to provide a semiconductor storage device capable of achieving a reduction in the area of a memory cell, an increase in speed, and an improvement in a characteristic of operation at low power supply voltage.

Solution to the Problem

To achieve the aforementioned object, a semiconductor storage device according to the present invention includes a plurality of memory cells sharing an output wiring. Each of the plurality of memory cells includes a storage circuit having a data holding node, a write circuit configured to write data to the storage circuit, and a read circuit configured to read data from the storage circuit. The read circuit includes a switching transistor configured to connect the data holding node and a control line in accordance with a first control signal, a reset transistor configured to reset the control line in accordance with a second control signal, and an output wiring driving transistor having a gate connected to the control line, a drain connected to the output wiring, and a source connected to a power supply.

Advantages of the Invention

According to the present invention, of the switching transistor, the reset transistor and the output wiring driving transistor which are included in the read circuit, only the output wiring driving transistor is interposed between the output wiring (e.g., a bit line) and the power supply, resulting in a relatively small transistor size.

In particular, in the case of a semiconductor storage device having a multiport configuration, a significant reduction in the area of a memory cell is achieved by the reduction in the transistor size of the read circuit. Moreover, when the number of wirings is large in the multiport-configuration semiconductor storage device, it is significantly advantageous that the overhead of wiring channels be unnecessary.

Moreover, a single transistor connected in series can be used to drive a bit line, the length of a bit line is reduced by the reduction in the size of a memory cell, the load capacitance of a bit line is reduced by the reduction in the size of a bit line driving transistor, and the like, whereby the transition of a bit line can be performed at high speed, and therefore, the speed of read operation can be increased. This is highly advantageous not only in terms of speed, but also in terms of ensuring of speed performance of low power supply voltage operation and ensuring of speed performance for higher capacity. Therefore, the memory capacity can be increased, operating power can be reduced by low power supply voltage operation, and the like.

DESCRIPTION OF EMBODIMENTS

Embodiments of a semiconductor storage device according to the present invention will be described in detail hereinafter with reference to the accompanying drawings.

Embodiment 1

Figure 1:
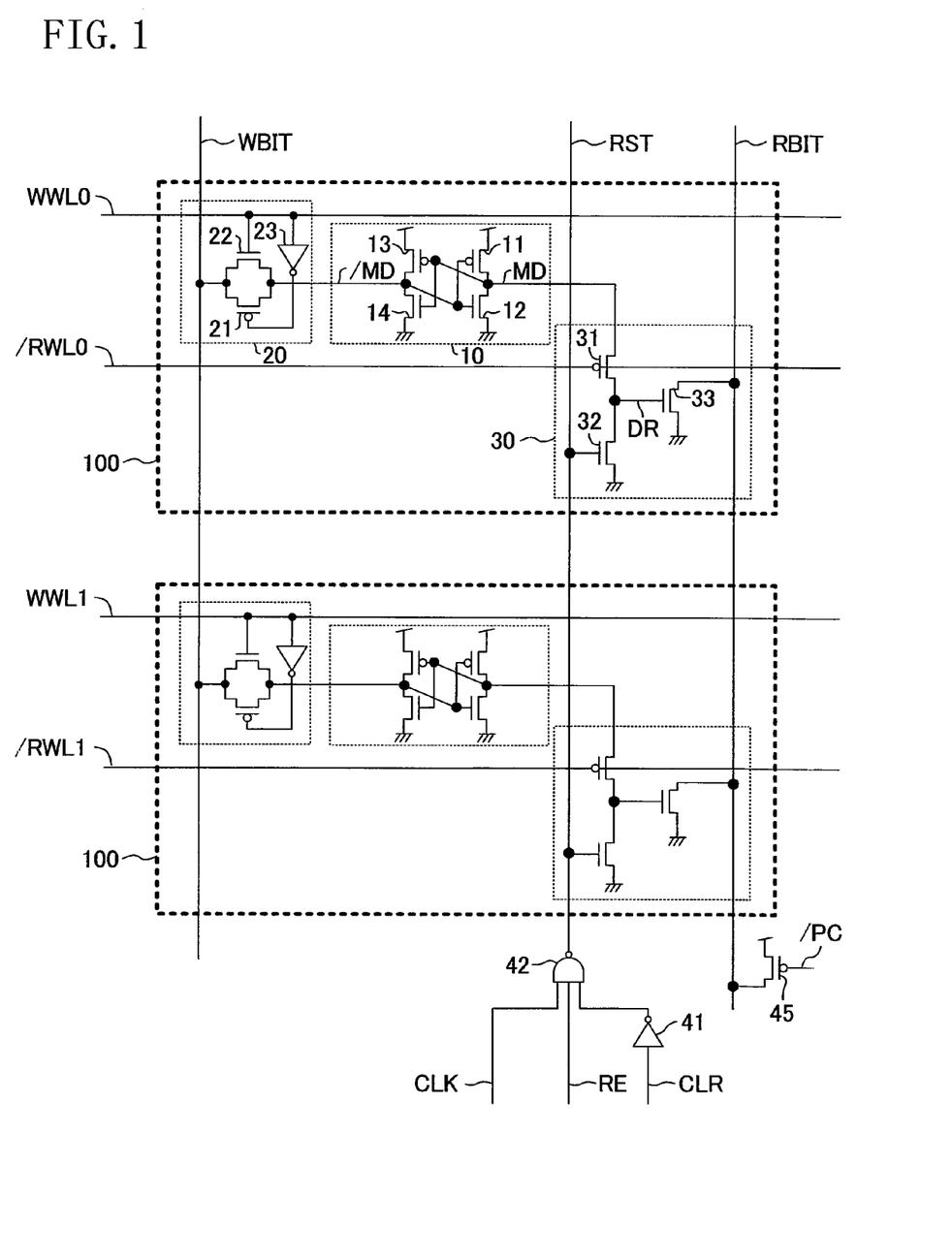
FIG. 1 is a circuit diagram showing a configuration of a semiconductor storage device according to Embodiment 1 of the present invention.

FIG. 1 is a circuit diagram of a semiconductor storage device according to Embodiment 1 of the present invention. The semiconductor storage device of FIG. 1 includes a plurality of memory cells 100 which share a write bit line WBIT and a read bit line RBIT. Each memory cell 100 includes a storage circuit 10 which stores data, a write circuit 20 which writes data to the storage circuit 10, and a read circuit 30 which reads data from the storage circuit 10.

The storage circuit 10 includes a PMOS transistor 11 and an NMOS transistor 12 constituting a first inverter, and a PMOS transistor 13 and an NMOS transistor 14 constituting a second inverter. An output node of the first inverter is connected as a TRUE-side data holding node MD to an input of the second inverter, while an output node of the second inverter is connected as a BAR-side data holding node /MD to an input of the first inverter.

The write circuit 20 includes a PMOS transistor 21 and an NMOS transistor 22 coupled between the write bit line WBIT and the BAR-side data holding node /MD of the storage circuit 10. The gate of the NMOS transistor 22 is connected to a write word line WWL0, and the write word line WWL0 is connected via an inverter 23 to the gate of the PMOS transistor 21.

The read circuit 30 includes a switching transistor 31, a reset transistor 32, and an output wiring driving transistor 33. The switching transistor 31 is a PMOS transistor having a gate connected to a read word line /RWL0, a source connected to the TRUE-side data holding node MD of the storage circuit 10, and a drain connected to an output wiring driving transistor control line DR. The reset transistor 32 is an NMOS transistor having a gate connected to a reset control signal RST, a drain connected to the output wiring driving transistor control line DR, and a source connected to a ground power supply. The output wiring driving transistor 33 is an NMOS transistor having a gate connected to the output wiring driving transistor control line DR, a drain connected to the read bit line RBIT, and a source connected to the ground power supply.

In the configuration of FIG. 1, the plurality of memory cells 100 connected to the same read bit line RBIT share the reset control signal RST. In FIG. 1, reference characters WWL1 and /RWL1 indicate a write word line and a read word line, respectively, for another word. Reference character CLK indicates a clock signal, reference character RE indicates a read enable signal, reference character CLR indicates an all-bit clear signal, reference character 41 indicates an inverter, and reference character 42 indicates a NAND gate which drives the reset control signal RST. Moreover, reference character /PC indicates a precharge control signal, and reference character 45 indicates a precharge transistor connected to the read bit line RBIT.

Figure 2:
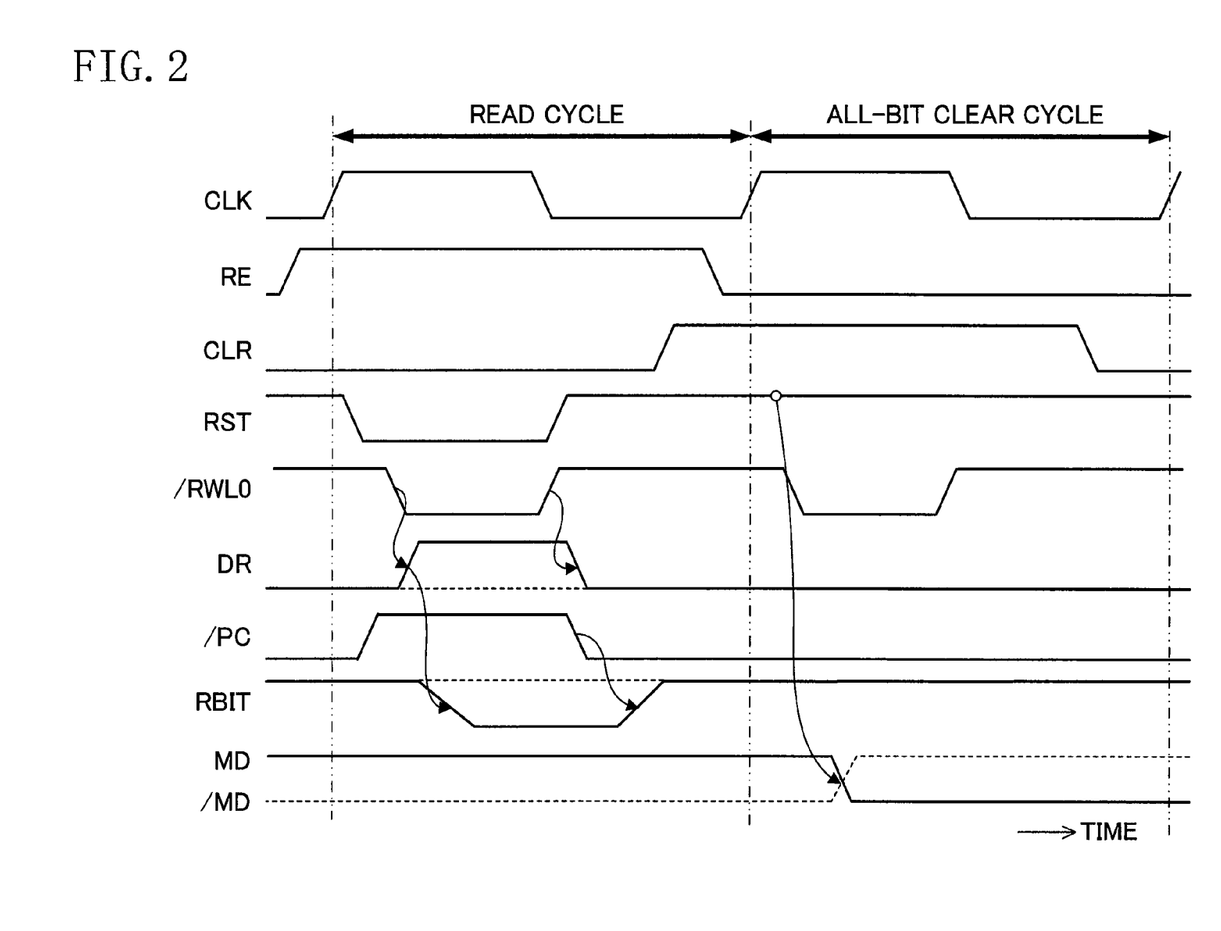
FIG. 2 is a timing diagram showing operation of the semiconductor storage device of FIG. 1.

Operation of the circuit of FIG. 1 will be described with reference to a timing diagram shown in FIG. 2. When the clock signal CLK goes from low to high, then if the read enable signal RE is active (high), the circuit performs a read operation during the cycle (i.e., a read cycle). After the clock signal CLK goes from low to high, the reset control signal RST goes from high to low. As a result, the output wiring driving transistor control line DR is placed in a floating state. Thereafter, a read word line /RWL0 is uniquely selected based on an input address, and the read word line /RWL0 goes from high to low. The switching transistor 31 which is connected to the word line /RWL0 which has gone from high to low is turned on.

In this case, if the TRUE-side data holding node MD of the storage circuit 10 is high, the output wiring driving transistor control line DR goes from low to high, and the output wiring driving transistor 33 discharges the read bit line RBIT. If the TRUE-side data holding node MD of the storage circuit 10 is low, the output wiring driving transistor control line DR remains low and the output wiring driving transistor 33 remains off, and the read bit line RBIT is maintained in the high state.

Thereafter, the read word line /RWL0 goes from low to high, and the switching transistor 31 is turned off. Thereafter, the reset control signal RST goes from low to high, and the reset transistor 32 is turned on, whereby the output wiring driving transistor control line DR is reset to low.

Next, the all-bit clear operation will be described. When the clock signal CLK goes from low to high, then if the all-bit clear signal CLR is active (high), the circuit performs the all-bit clear operation during the cycle (i.e., an all-bit clear cycle). During the all-bit clear cycle, the reset control signal RST is maintained high, and the output wiring driving transistor control line DR is maintained low. Thereafter, a read word line /RWL0 for a word desired to be cleared goes from high to low, and the switching transistor 31 connected to the read word line /RWL0 which has gone from high to low is turned on. In this case, the output wiring driving transistor control line DR is maintained low, and therefore, the data low is written to the TRUE-side data holding node MD of the storage circuit 10. After this write operation is completed, the read word line /RWL0 goes high, so that the switching transistor 31 is turned off and the all-bit clear operation is ended.

According to this embodiment, safety against write error during read operation is high, and the memory cell 100 capable of high-speed read operation can be achieved with a smaller area and without overhead of wiring channels.

Moreover, even when the load of the read bit line RBIT is great, the speed is reduced to a small degree, and therefore, the memory capacity can be increased. Moreover, the speed is reduced to a small degree during operation in a state in which the power supply voltage is low, and therefore, the low power supply voltage operation can reduce power consumption.

Note that, when the read enable signal RE and the all-bit clear signal CLR are simultaneously turned on, read operation and clear operation are simultaneously performed. Therefore, in this case, by uniquely selecting an address, a specific word can be cleared and read during one cycle.

Moreover, if the gate width of the reset transistor 32 is designed to be greater than the gate width of the PMOS transistor 11 which drives the TRUE-side data holding node MD of the storage circuit 10 into the high state, the speed and stability of the clear operation can be improved. Alternatively, a similar advantage can be obtained if the gate length of the reset transistor 32 is designed to be shorter than the gate length of the PMOS transistor 11.

Memory cells 100 which are adjacent to each other may share a reset transistor 32. Moreover, an inverted version of the precharge control signal /PC may be used as the reset control signal RST.

Embodiment 2

Figure 3:
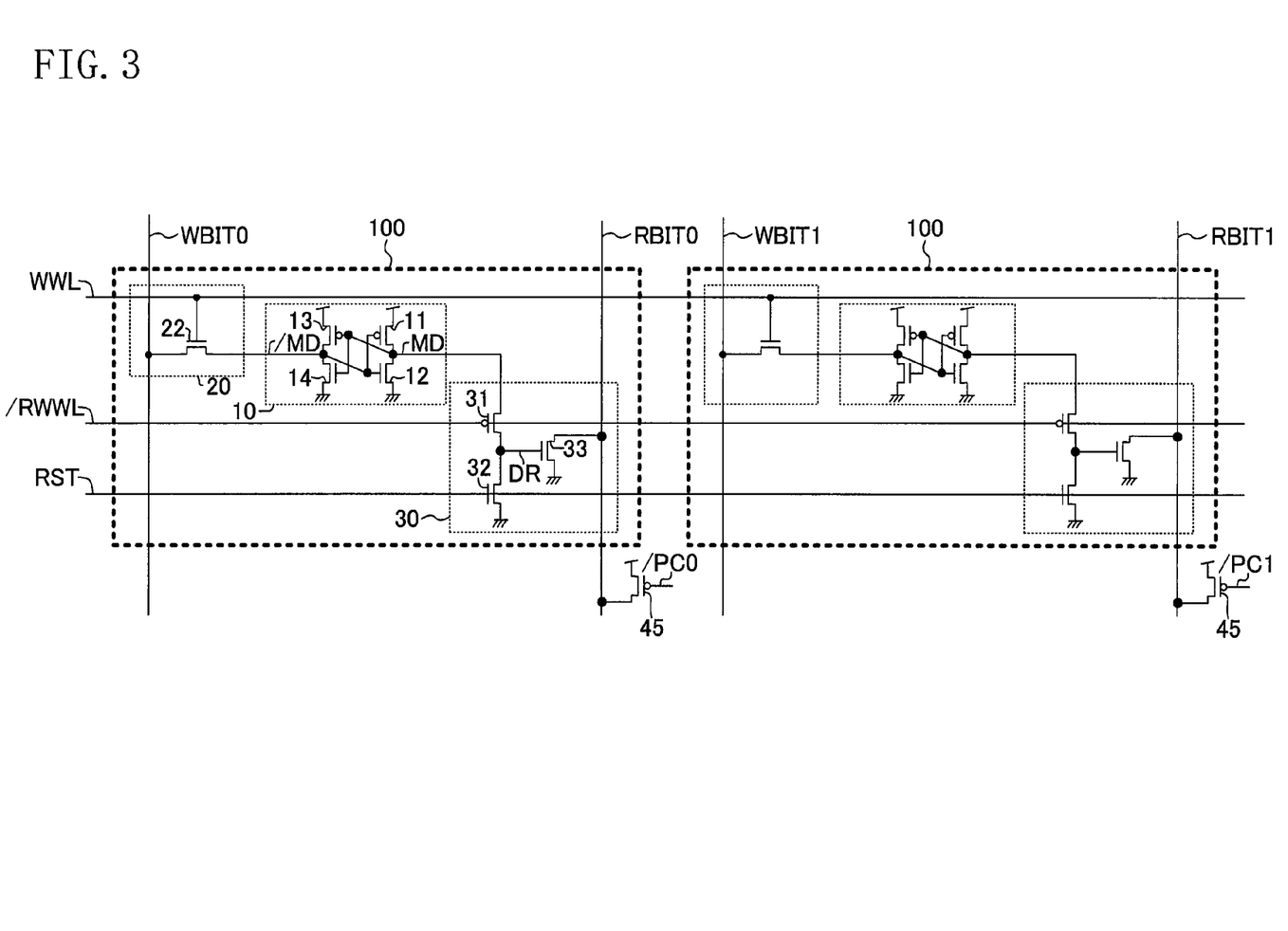
FIG. 3 is a block diagram showing a configuration of a semiconductor storage device according to Embodiment 2 of the present invention.

FIG. 3 is a circuit diagram of a semiconductor storage device according to Embodiment 2 of the present invention. The semiconductor storage device of FIG. 3 includes a plurality of memory cells 100 which are connected to the same write word line WWL and the same read/write word line /RWWL and share a reset control signal RST. In FIG. 3, reference characters WBIT0 and RBIT0 indicate a write bit line and a read bit line for bit 0, respectively, and reference characters WBIT1 and RBIT1 indicate a write bit line and a read bit line for bit 1, respectively. Reference characters /PC0 and /PC1 indicate precharge control signals.

In the configuration of FIG. 3, a reset transistor 32 is used to initialize a storage circuit 10 before a write circuit 20 is used to write desired data. This configuration has an advantage that the reset transistor 32 is used to initialize the storage circuit 10 on the read/write word line /RWWL which is to be written, before the write operation is performed, and therefore, the write circuit 20 needs to have only a function of writing data complementary to the initialized data, whereby the number of components constituting the write circuit 20 can be reduced.

Figure 4:
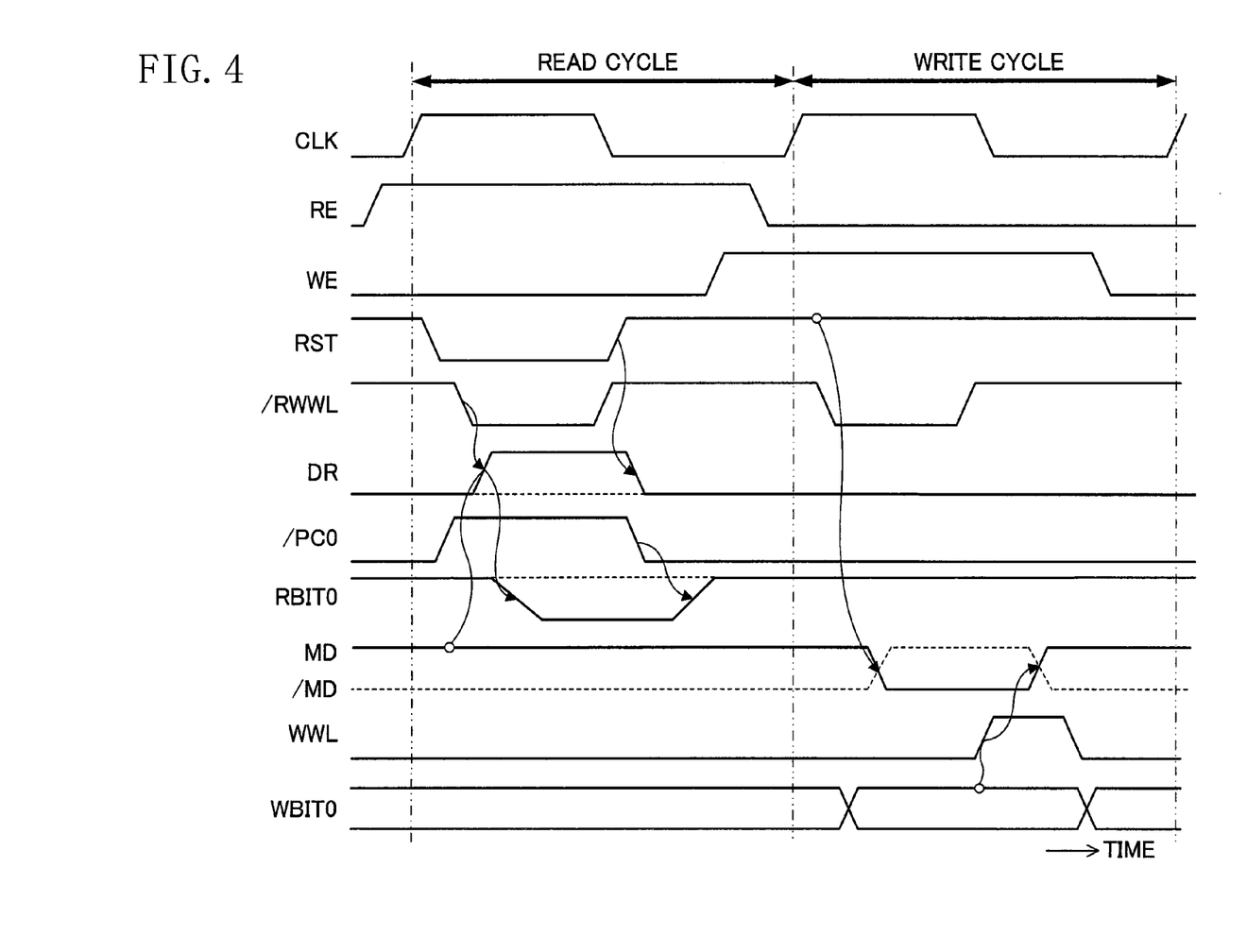
FIG. 4 is a timing diagram showing operation of the semiconductor storage device of FIG. 3.

Operation of the circuit of FIG. 3 will be described with reference to the timing diagram of FIG. 4. Firstly, read operation will be described. During read cycles, after the clock signal CLK goes from low to high, the reset control signal RST goes from high to low. As a result, an output wiring driving transistor control line DR is placed in a floating state. Thereafter, a read/write word line /RWWL is uniquely selected based on an input address, and the read/write word line /RWWL goes from high to low. A switching transistor 31 connected to the read/write word line /RWWL which has gone from high to low is turned on.

In this case, if a TRUE-side data holding node MD of the storage circuit 10 is high, the output wiring driving transistor control line DR goes from low to high, and an output wiring driving transistor 33 discharges the read bit line RBIT0. If the TRUE-side data holding node MD of the storage circuit 10 is low, the output wiring driving transistor control line DR remains low and the output wiring driving transistor 33 remains off, and the read bit line RBIT0 is maintained in the high state.

Thereafter, the read/write word line /RWWL goes from low to high, and the switching transistor 31 is turned off. Thereafter, the reset control signal RST goes from low to high, and the reset transistor 32 is turned on, whereby the output wiring driving transistor control line DR is reset to low.

Next, write operation will be described. During write cycles, even after the clock signal CLK goes from low to high, the reset control signal RST remains high, and the output wiring driving transistor control line DR continues to be driven into the low state. Thereafter, a read/write word line /RWWL is uniquely selected based on an input address, and the read/write word line /RWWL goes from high to low. A switching transistor 31 connected to the read/write word line /RWWL which has gone from high to low is turned on. In this case, the data low is written into the TRUE-side data holding node MD of the storage circuit 10. Thereafter, the read/write word line /RWWL is closed, and a write word line WWL for a word selected above goes from low to high. In this case, if data to be written is high, the write bit line WBIT0 is low, and therefore, the data high is written into the TRUE-side data holding node MD of the storage circuit 10 when the write word line WWL is turned on. If data to be written is low, the write bit line WBIT0 is high, and therefore, the TRUE-side data holding node MD of the storage circuit 10 holds the data low and does not change. Thereafter, the write word line WWL goes from high to low, and the write operation is ended.

Note that, by causing the gate width of the reset transistor 32 to be greater than the gate width of the PMOS transistor 11 which drives the TRUE-side data holding node MD of the storage circuit 10 into the high state, the speed and stability of clear operation can be improved. Alternatively, a similar advantage can be obtained by causing the gate length of the reset transistor 32 to be shorter than the gate length of the PMOS transistor 11.

Embodiment 3

Figure 5:
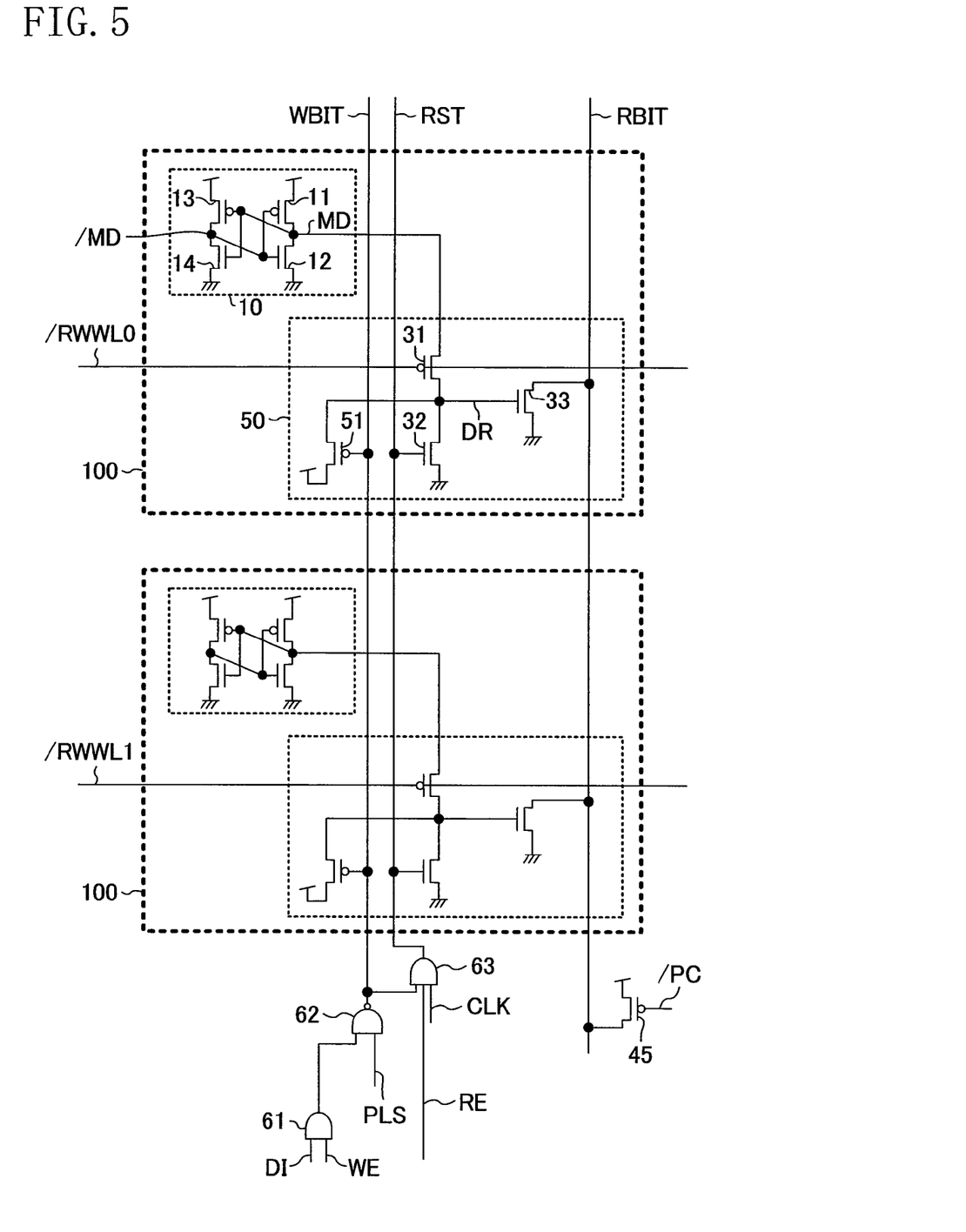
FIG. 5 is a block diagram showing a configuration of a semiconductor storage device according to Embodiment 3 of the present invention.

FIG. 5 is a circuit diagram showing a semiconductor storage device according to Embodiment 3 of the present invention. In FIG. 5, reference character 50 indicates a read/write circuit. The read/write circuit 50 includes a switching transistor 31 which connects a TRUE-side data holding node MD of a storage circuit 10 and an output wiring driving transistor control line DR during read operation and write operation, a reset transistor 32 which has not only a function of resetting the output wiring driving transistor control line DR, but also a function of initializing the storage circuit 10, and an output wiring driving transistor 33 which is connected to a read bit line RBIT, and in addition, a write transistor 51 which writes data complementary to initialized data to the storage circuit 10. Reference characters /RWWL0 and /RWWL1 indicate read/write word lines. Reference character DI indicates an input data signal, reference character WE indicates a write enable signal, reference character PLS indicates a pulse signal, reference characters 61 and 63 indicate AND gates, and reference character 62 indicates a NAND gate.

The configuration of FIG. 5 has an advantage that read operation can be performed at high speed, and in addition, an advantage that a read word line and a write word line can be integrated into the read/write word line /RWWL0, and therefore, the degree of congestion in the word line direction of wirings can be reduced, whereby an increase in layout area caused by a limitation on wiring can be reduced. This is particularly effective when the memory cell 100 is shorter in the bit line direction than in the word line direction. Moreover, the parasitic coupling capacitance of the read/write word line /RWWL0 can be reduced, and therefore, the transition of the read/write word line /RWWL0 can be accelerated.

Figure 6:
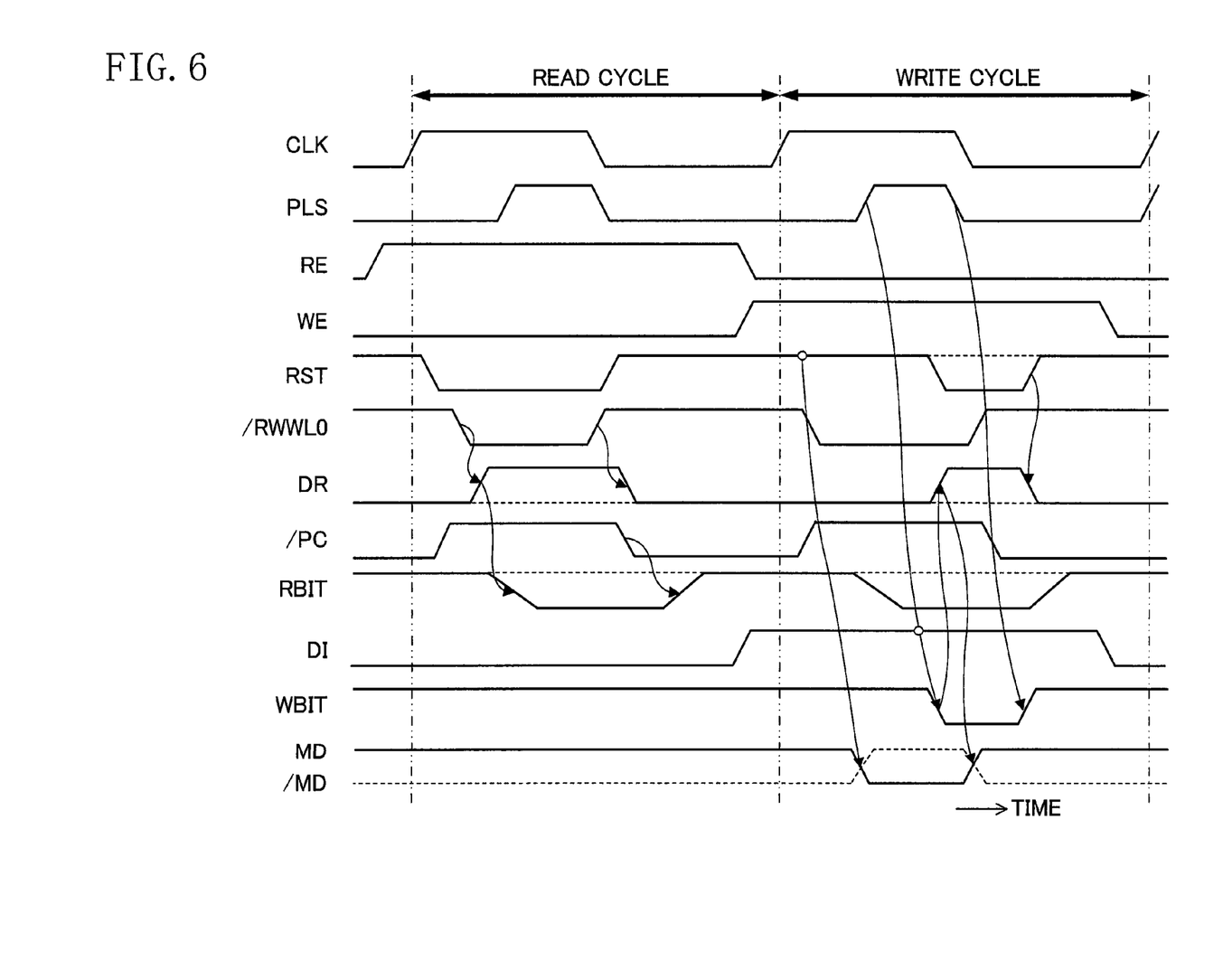
FIG. 6 is a timing diagram showing operation of the semiconductor storage device of FIG. 5.

Operation of the circuit of FIG. 5 will be described with reference to a timing diagram shown in FIG. 6. Firstly, read operation will be described. During read cycles, after a clock signal CLK goes from low to high, a reset control signal RST goes from high to low. As a result, an output wiring driving transistor control line DR is placed in a floating state. Thereafter, a read/write word line /RWWL0 is uniquely selected based on an input address, and the read/write word line /RWWL0 goes from high to low. A switching transistor 31 connected to the read/write word line /RWWL0 which has gone from high to low is turned on.

In this case, if the TRUE-side data holding node MD of the storage circuit 10 is high, the output wiring driving transistor control line DR goes from low to high, and the output wiring driving transistor 33 discharges the read bit line RBIT. If the TRUE-side data holding node MD of the storage circuit 10 is low, the output wiring driving transistor control line DR remains low and the output wiring driving transistor 33 remains off, and the read bit line RBIT is maintained in the high state.

Thereafter, the read/write word line /RWWL0 goes from low to high, and the switching transistor 31 is turned off. Thereafter, the reset control signal RST goes from low to high, and the reset transistor 32 is turned on, whereby the output wiring driving transistor control line DR is reset to low.

Next, write operation will be described. During write cycles, even after the clock signal CLK goes from low to high, the reset control signal RST remains high, and the output wiring driving transistor control line DR continues to be driven into the low state. Thereafter, a read/write word line /RWWL0 is uniquely selected based on an input address, and the read/write word line /RWWL0 goes from high to low. A switching transistor 31 connected to the read/write word line /RWWL0 which has gone from high to low is turned on. In this case, the data low is written into the TRUE-side data holding node MD of the storage circuit 10. Thereafter, when the pulse signal PLS goes from low to high, then if the input data signal DI is high, the write bit line WBIT goes from high to low, and at the same time, the reset control signal RST goes from high to low. As a result, the reset transistor 32 is turned off, the write transistor 51 is turned on, and the output wiring driving transistor control line DR goes from low to high. In this case, the data high is written via the switching transistor 31 to the storage circuit 10. Thereafter, the read/write word line /RWWL0 goes from low to high, and the switching transistor 31 is turned off, and the write operation is ended.

Note that, in order to further increase the speed, a parallel circuit of a PMOS transistor and an NMOS transistor may be employed instead of the switching transistor 31 which is a PMOS transistor.

Embodiment 4

Figure 7:
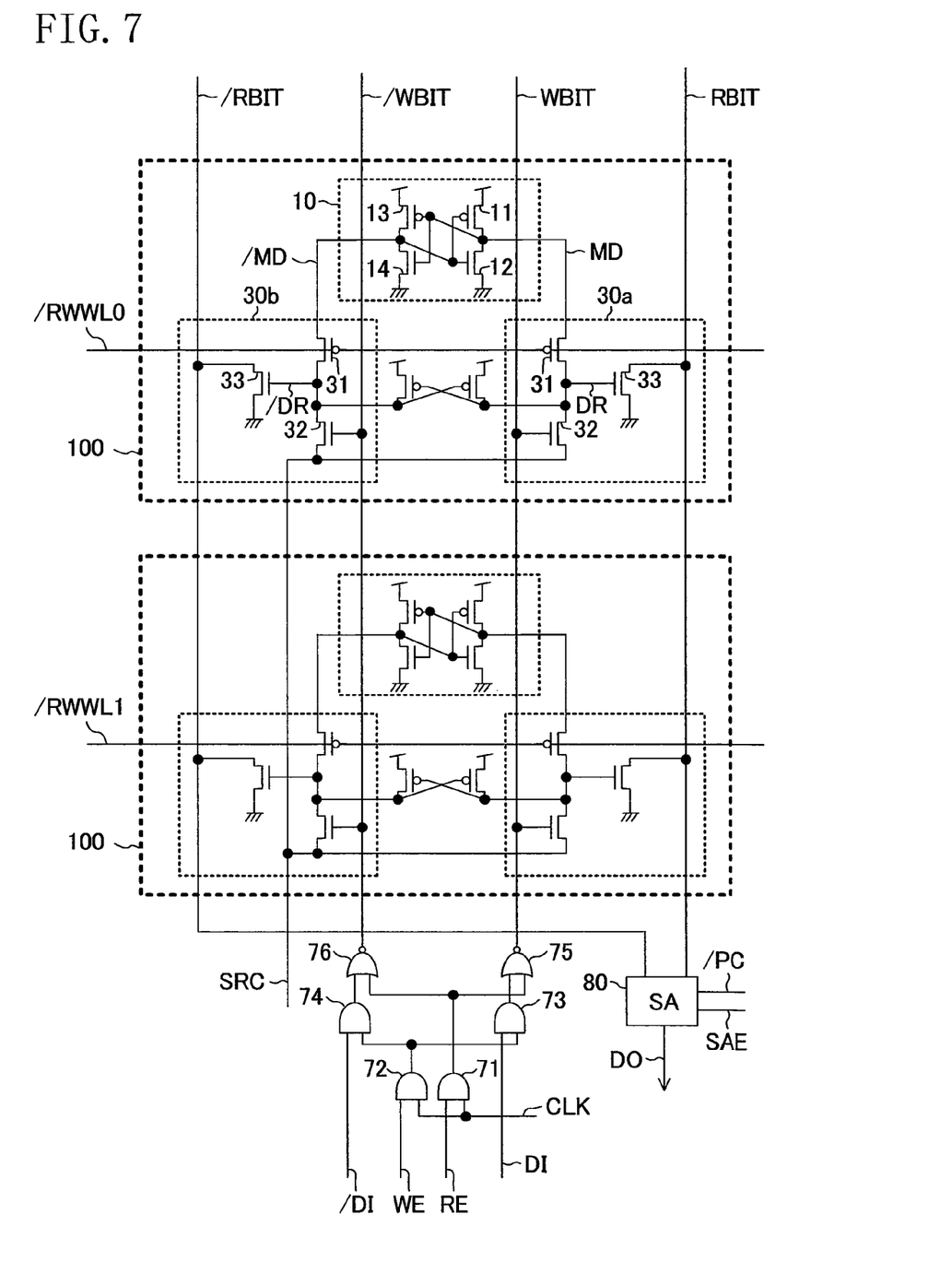
FIG. 7 is a block diagram showing a configuration of a semiconductor storage device according to Embodiment 4 of the present invention.
Figure 8:
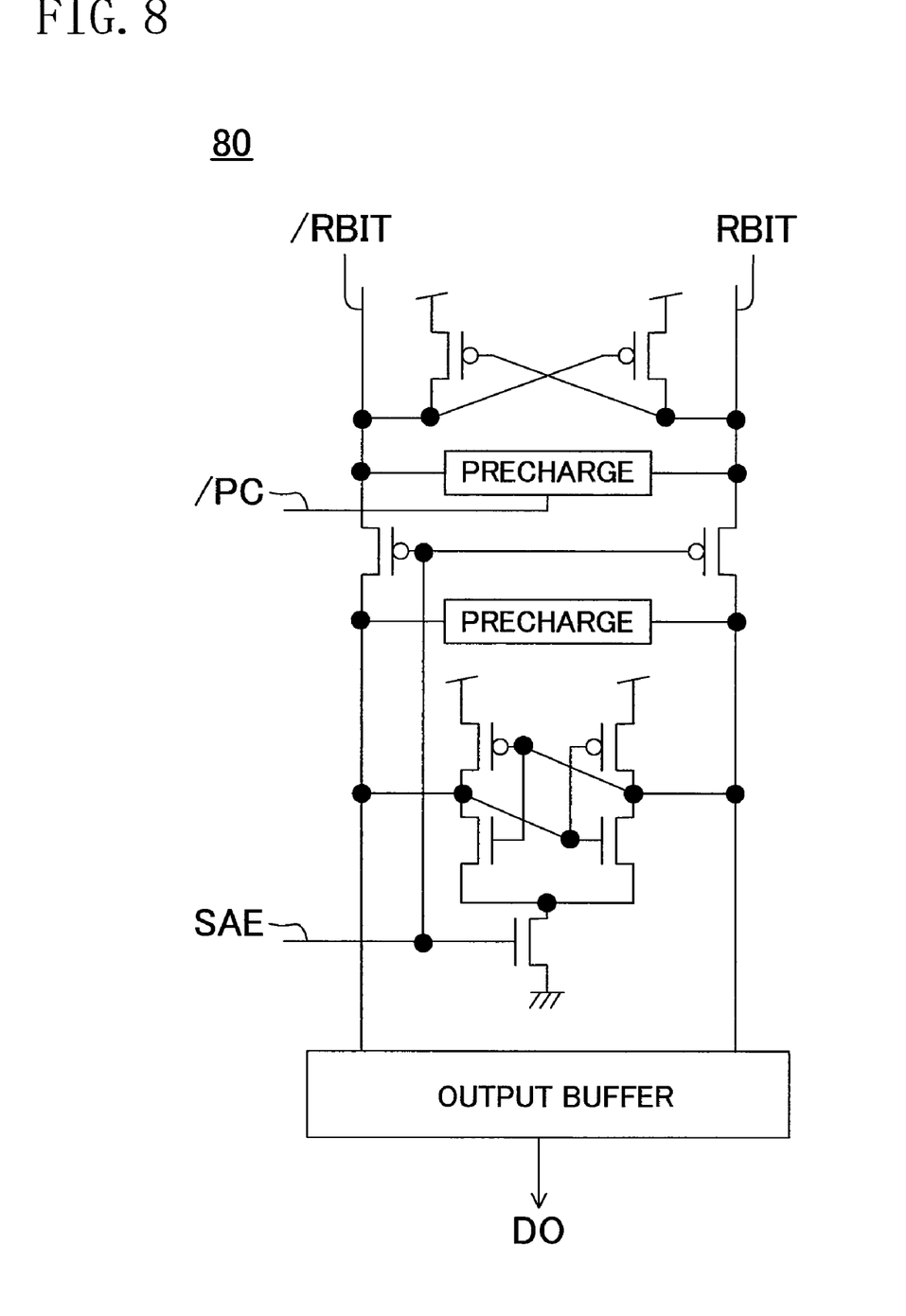
FIG. 8 is a circuit diagram showing a detailed configuration of a sense amplifier of FIG. 7.

FIG. 7 is a circuit diagram of a semiconductor storage device according to Embodiment 4 of the present invention. As shown in FIG. 7, in each memory cell 100, a pair of read circuits 30a and 30b are provided corresponding to a pair of data holding nodes MD and /MD in a storage circuit 10, and a pair of write bit lines WBIT and /WBIT and a pair of read bit lines RBIT and /RBIT are further provided. Reference characters 71-74 indicate AND gates, and reference characters 75 and 76 indicate NOR gates. A sense amplifier 80 which is connected to the pair of read bit lines RBIT and /RBIT is operated in response to a sense amplifier enable signal SAE to supply an output data signal DO. FIG. 8 is a circuit diagram of the sense amplifier 80 of FIG. 7.

In the configuration of FIG. 7, in order to further increase the speed, reset transistors 32 perform voltage drop with respect to the read bit lines RBIT and /RBIT before data read operation. Reference character SRC indicates a source power supply line for the reset transistors 32.

Figure 9:
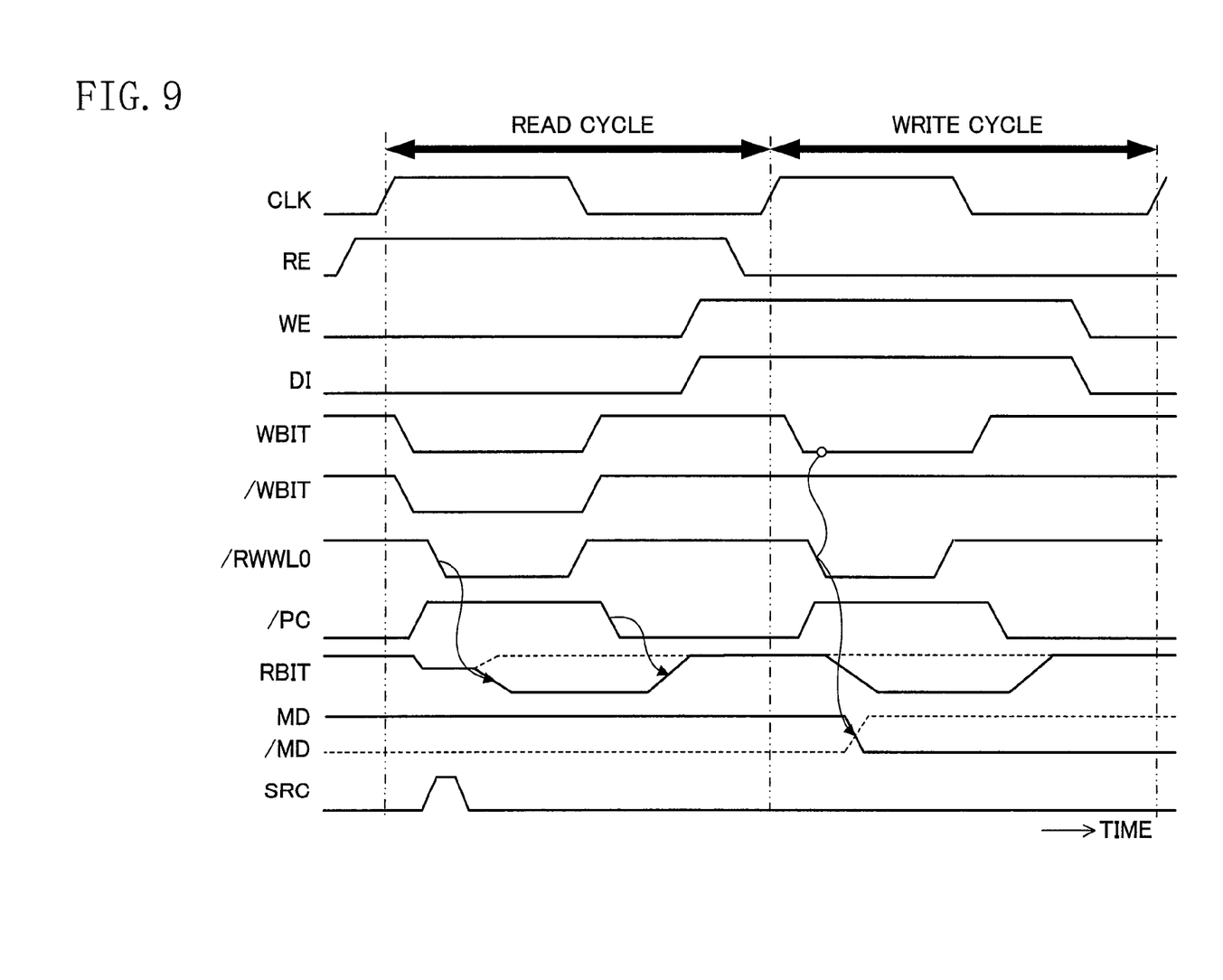
FIG. 9 is a timing diagram showing operation of the semiconductor storage device of FIG. 7.

Operation of the circuit of FIG. 7 will be described with reference to a timing diagram shown in FIG. 9. Firstly, read operation will be described. During read cycles, after a clock signal CLK goes from low to high, the voltage of the source power supply line SRC for the reset transistor 32 is increased from a ground level to a power supply voltage level. As a result, a pair of output wiring driving transistor control lines DR and /DR both go from the power supply voltage level to a voltage level which is lower than the power supply voltage level by the threshold voltage of an NMOS transistor, and therefore, a pair of output wiring driving transistors 33 are turned on to some extent, so that the pair of read bit lines RBIT and /RBIT are both discharged. When the pair of read bit lines RBIT and /RBIT are discharged to a predetermined level, the source power supply line SRC goes from high to low, and the discharging is interrupted. Thereafter, a read/write word line /RWWL0 is uniquely selected based on an input address, and the read/write word line /RWWL0 goes from high to low. Switching transistors 31 connected to the read/write word line /RWWL0 which has gone from high to low are turned on, and therefore, information of data stored in the memory cell 100 is passed to the read bit lines RBIT and /RBIT. Moreover, signal changes on the read bit lines RBIT and /RBIT are amplified and output by the sense amplifier 80. Thereafter, the read/write word line /RWWL0 is turned off, and the read operation is ended.

Next, write operation will be described. During write cycles, when the clock signal CLK goes from low to high, then if an input data signal DI is high, the write bit line WBIT goes from high to low, and the inverted write bit line /WBIT is maintained high. Thereafter, a read/write word line /RWWL0 is uniquely selected based on an input address, and the read/write word line /RWWL0 goes from high to low. The switching transistors 31 connected to the read/write word line /RWWL0 which has gone from high to low are turned on. In this case, the data low is written into the TRUE-side data holding node MD of the storage circuit 10.

On the other hand, if the input data signal DI is low, the write bit line WBIT is maintained high, and the inverted write bit line /WBIT goes from high to low. In this case, when the read/write word line /RWWL0 is selected, the data high is written into the TRUE-side data holding node MD of the storage circuit 10. Thereafter, the write enable signal WE goes from high to low, and the write operation is ended.

Embodiment 5

Figure 10:
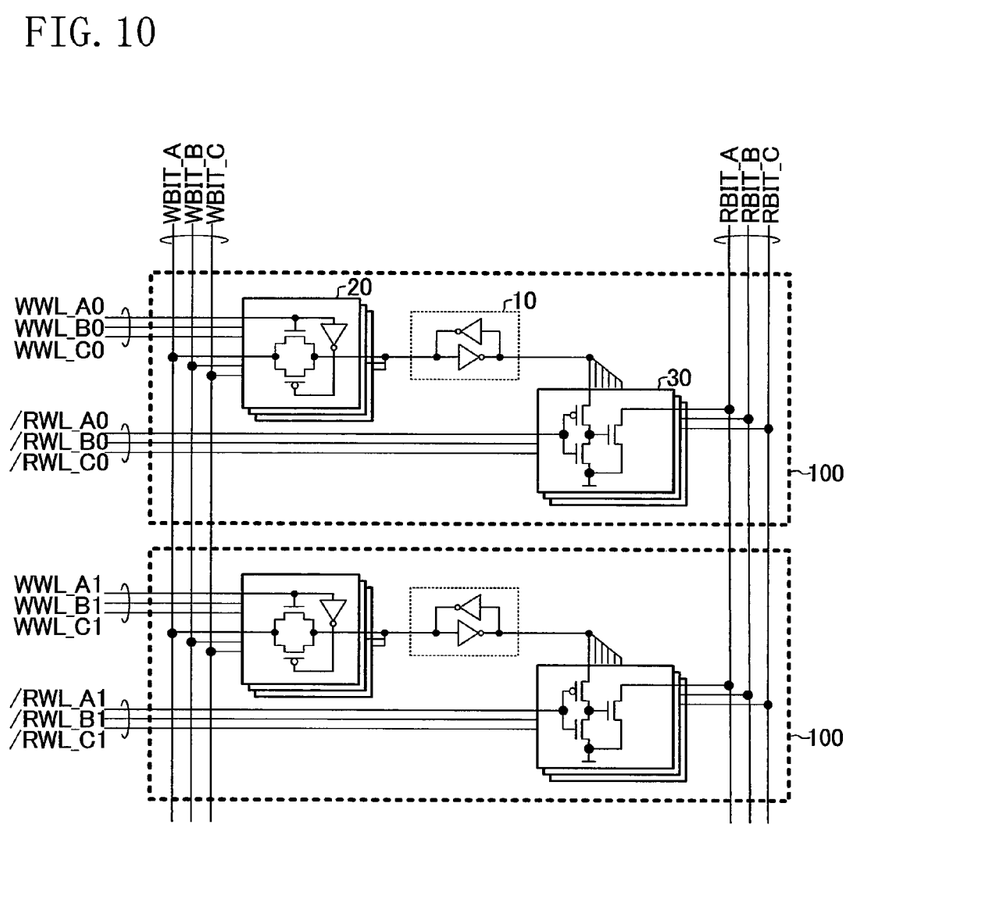
FIG. 10 is a block diagram showing a configuration of a semiconductor storage device according to Embodiment 5 of the present invention.

FIG. 10 is a circuit diagram of a semiconductor storage device according to Embodiment 5 of the present invention. In each memory cell 100, a plurality of write circuits 20 and a plurality of read circuits 30 are connected to one storage circuit 10, resulting in a significant reduction in area. Moreover, a read word line /RWL at each port also serves as a reset control signal for the corresponding read circuit 30.

Embodiment 6

Figure 11:
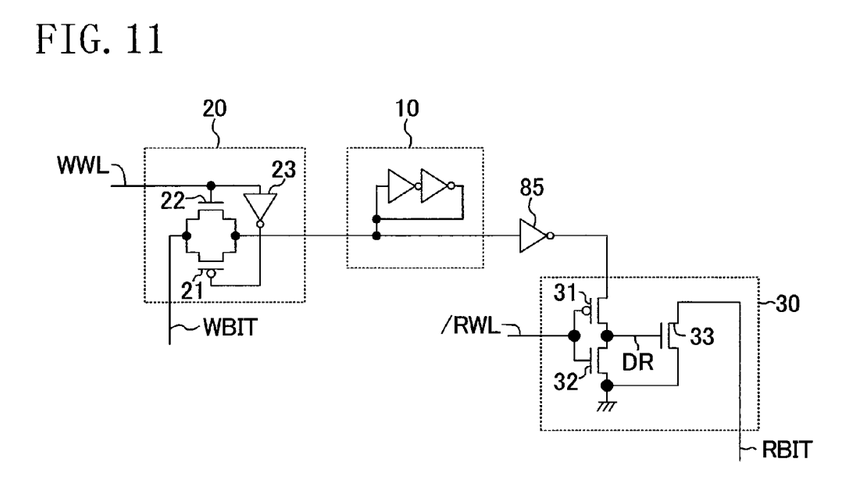
FIG. 11 is a block diagram showing a configuration of a semiconductor storage device according to Embodiment 6 of the present invention.

FIG. 11 is a circuit diagram of a semiconductor storage device according to Embodiment 6 of the present invention. As shown in FIG. 11, a single inverter 85 is interposed between a data holding node of a storage circuit 10 and a switching transistor 31 of a read circuit 30.

During read cycles, when a read word line /RWL goes from high to low, the switching transistor 31 starts being turned on, and a reset transistor 32 starts being turned off. When the inverter 85 is not provided, a current is passed from the data holding node of the storage circuit 10 through the switching transistor 31 and the reset transistor 32 to a source ground power supply for the reset transistor 32, and therefore, there is a risk of destruction of data in the storage circuit 10. Therefore, the inverter 85 is provided between the storage circuit 10 and the switching transistor 31 to prevent the destruction of data in the storage circuit 10 by the passing current.

Although it has been assumed in the example of FIG. 11 that the switching transistor 31 and the reset transistor 32 share a control signal, the switching transistor 31 and the reset transistor 32 may receive separate control signals. Also in this case, if the timing of control is deviated due to an influence of variations in devices or the like, there is a risk that the aforementioned passing current may flow. Also in such a case, by providing the inverter 85, it is possible to prevent the destruction of data in the storage circuit 10 by the passing current.

Embodiment 7

Figure 12:
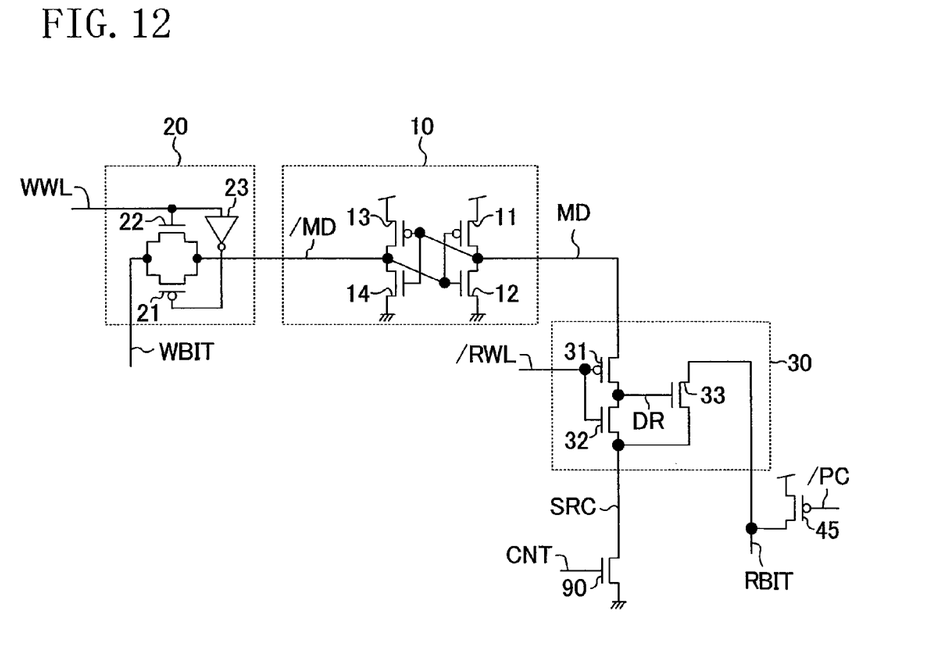
FIG. 12 is a block diagram showing a configuration of a semiconductor storage device according to Embodiment 7 of the present invention.

FIG. 12 is a circuit diagram of a semiconductor storage device according to Embodiment 7 of the present invention. As shown in FIG. 12, in order to prevent destruction of data in a storage circuit 10 by a passing current, a source power supply line control transistor 90 is provided on a source power supply line SRC for a reset transistor 32 to control power supply to the reset transistor 32 in accordance with a source power supply line control signal CNT.

During read cycles, when a read word line /RWL goes from high to low, a switching transistor 31 starts being turned on, and the reset transistor 32 starts being turned off. On the other hand, the source power supply line control signal CNT is maintained low so that the source power supply line control transistor 90 is turned off, and therefore, the source power supply line SRC is placed in a floating state. When the switching transistor 31 starts being turned on and the reset transistor 32 starts being turned off, a current is not passed through the switching transistor 31 or the reset transistor 32, due to the floating state of the source power supply line SRC, whereby erroneous write operation can be prevented with respect to a TRUE-side data holding node MD of the storage circuit 10. The source power supply line control transistor 90 can be shared by a plurality of storage circuits 10 so that the area is reduced.

Note that, if the gate width of a PMOS transistor 11 which drives the TRUE-side data holding node MD in the storage circuit 10 of FIG. 12 is designed to be greater than the gate width of an NMOS transistor constituting the reset transistor 32, the destruction of data in the storage circuit 10 by the passing current can be prevented without the source power supply line control transistor 90. A similar advantage can be obtained if the gate length of the PMOS transistor 11 is designed to be shorter than the gate length of the NMOS transistor constituting the reset transistor 32. Moreover, a similar advantage can be obtained if the threshold voltage of the NMOS transistor constituting the reset transistor 32 is designed to be higher than the threshold voltage of the transistor 11 included in the storage circuit 10. As used herein, the term "threshold voltage" refers to the amount of a change in an input voltage at which a predetermined current starts flowing to an output. Specifically, a high threshold voltage means that a large change in an input voltage is required for passing a predetermined current or higher to an output.

The examples in which the switching transistor 31 is a PMOS transistor, the reset transistor 32 is an NMOS transistor, and the output wiring driving transistor 33 is an NMOS transistor have been described above in Embodiments 1-7 of the present invention. Alternatively, the switching transistor 31 may be an NMOS transistor, the reset transistor 32 may be a PMOS transistor, and the output wiring driving transistor 33 may be a PMOS transistor.

INDUSTRIAL APPLICABILITY

As described above, the semiconductor storage device of the present invention can reduce the area of each memory cell, increase the speed, and improve a characteristic of low power supply voltage operation, and is particularly useful as multi-port memories, such as a register file and the like.

DESCRIPTION OF REFERENCE CHARACTERS

10 Storage Circuit
20 Write Circuit
30 Read Circuit
31 Switching Transistor
32 Reset Transistor
33 Output Wiring Driving Transistor
45 Precharge Transistor
50 Read/Write Circuit
51 Write Transistor
80 Sense Amplifier
85 Inverter
90 Source Power Supply Line Control Transistor
100 Memory Cell
CLK Clock Signal
CLR All-bit Clear Signal
CNT Source Power Supply Line Control Signal
DI, /DI Input Data Signal
DO Output Data Signal
DR Output Wiring Driving Transistor Control Line
MD, /MD Storage Circuit Data Holding Node
PLS Pulse Signal
RBIT, /RBIT Read Bit Line
RBIT0, RBIT1 Read Bit Line
RE Read Enable Signal
RST Reset Control Signal
SAE Sense Amplifier Enable Signal
SRC Source Power Supply Line
WBIT, /WBIT Write Bit Line
WBIT0, WBIT1 Write Bit Line
WE Write Enable Signal
WWL, WWL0, WWL1 Write Word Line
/PC, /PC0, /PC1 Precharge Control Signal
/RWL, /RWL0, /RWL1 Read Word Line
/RWWL, /RWWL0, /RWWL1 Read/Write Word Line

The invention claimed is:

1. A semiconductor storage device comprising:
a plurality of memory cells sharing an output wiring, wherein
each of the plurality of memory cells includes
a storage circuit having a data holding node,
a write circuit configured to write data to the storage circuit, and
a read circuit configured to read data from the storage circuit, and
the read circuit includes
a switching transistor configured to connect the data holding node and a control line in accordance with a first control signal,
a reset transistor configured to reset the control line in accordance with a second control signal, and
an output wiring driving transistor having a gate connected to the control line, a drain connected to the output wiring, and a source connected to a power supply.

2. The semiconductor storage device of claim 1, wherein
the switching transistor includes a first-conductivity type transistor having a gate connected to the first control signal, a source connected to the data holding node, and a drain connected to the control line,
the reset transistor includes a second-conductivity type transistor having a gate connected to the second control signal, a drain connected to the control line, and a source connected to a power supply, and the output wiring driving transistor includes a second-conductivity type transistor having a gate connected to the control line, a drain connected to the output wiring, and a source connected to a power supply.

3. The semiconductor storage device of claim 2, wherein a gate width of a first-conductivity type transistor configured to drive the data holding node in the storage circuit is greater than a gate width of the second-conductivity type transistor included in the reset transistor.

4. The semiconductor storage device of claim 2, wherein a gate length of a first-conductivity type transistor configured to drive the data holding node in the storage circuit is shorter than a gate length of the second-conductivity type transistor included in the reset transistor.

5. The semiconductor storage device of claim 2, wherein a threshold voltage of the second-conductivity type transistor included in the reset transistor is higher than a threshold voltage of a transistor included in the storage circuit.

6. The semiconductor storage device of claim 1, wherein the output wiring shared by the plurality of memory cells is a bit line, and the plurality of memory cells connected to the same bit line share the second control signal.

7. The semiconductor storage device of claim 1, wherein a plurality of memory cells share a word line configured to supply the first control signal to the switching transistor, and the plurality of memory cells connected to the same word line share the second control signal.

8. The semiconductor storage device of claim 1, wherein the reset transistor further has a function of initializing the storage circuit.

9. The semiconductor storage device of claim 8, wherein a gate width of the reset transistor is greater than a gate width of a transistor included in the storage circuit.

10. The semiconductor storage device of claim 8, further comprising:

a write transistor configured to write data complementary to the initialized data to the storage circuit.

11. The semiconductor storage device of claim 1, wherein the read circuit is connected to each of a pair of data holding nodes in the storage circuit, and the semiconductor storage device further includes a sense amplifier configured to receive output wirings of the read circuit.

12. The semiconductor storage device of claim 1, wherein the reset transistor further has a function of performing voltage drop with respect to the output wiring before reading of data.

13. The semiconductor storage device of claim 1, wherein a plurality of write circuits and a plurality of read circuits are connected to the storage circuit.

14. The semiconductor storage device of claim 1, further comprising:

at least one inverter interposed between the data holding node and the switching transistor.

15. The semiconductor storage device of claim 1, wherein a power supply for the reset transistor is controlled in accordance with a third control signal.

* * * * *